US012562694B2

(12) United States Patent
     Kuells

(10) Patent No.: US 12,562,694 B2
(45) Date of Patent: Feb. 24, 2026

(54) POWER SHARING MULTI-CHANNEL AMPLIFIER

(71) Applicant: MITEK CORPORATION, Phoenix, AZ (US)

(72) Inventor: Jeffery B. Kuells, Foresthill, CA (US)

(73) Assignee: MITEK CORPORATION, Phoenix, AZ (US)

( * ) Notice: Subject to any disclaimer, the term of this patent is extended or adjusted under 35 U.S.C. 154(b) by 211 days.

(21) Appl. No.: 18/401,250

(22) Filed: Dec. 29, 2023

(65) Prior Publication Data

US 2025/0219595 A1     Jul. 3, 2025

(51) Int. Cl.
     *H03F 3/181*     (2006.01)
     *H04R 5/04*      (2006.01)

(52) U.S. Cl.
     CPC ............... *H03F 3/181* (2013.01); *H04R 5/04* (2013.01); *H03F 2200/03* (2013.01)

(58) Field of Classification Search
     CPC ........ H03F 3/181; H03F 2200/03; H03F 3/68; H04R 5/04; H04R 3/12
     USPC ............................... 381/28, 120, 123, 80, 81
     See application file for complete search history.

(56) References Cited

U.S. PATENT DOCUMENTS 4,425,613 A     1/1984  Shelly
5,875,250 A  *  2/1999  Kuo .......................... H03F 3/68
                                                        381/80

6,006,111 A     12/1999  Rowland
6,028,944 A  *   2/2000  Markow ................ H03G 7/007
                                                         381/107
6,218,897 B1 *   4/2001  Barzegar .................. H03F 3/68
                                                         330/297

(Continued)

FOREIGN PATENT DOCUMENTS

CN          103843229 B     2/2018
CN          107728694 B     1/2020

(Continued)

OTHER PUBLICATIONS

BOSE: "PowerShare Editor User's Guide", Aug. 1, 2017, pp. 1-43.

(Continued)

*Primary Examiner* — Xu Mei
(74) *Attorney, Agent, or Firm* — Hansen Reynolds LLC

(57)          ABSTRACT

A multichannel amplifier system having a power supply with a specific power output rating. The system includes first and second output channels, each featuring power amplifiers, adjustable voltage limiters, and adjustable impedance circuits. A restriction controller with predefined partial power settings enables adjustment of voltage or impedance based on specific restriction modes. Power distribution balance between output channels is regulated by a multi-contact switch. Real-time data from the output channels, obtained through a sensor system including temperature, current, and voltage sensors, allows dynamic adjustments within predefined limits. The system also incorporates an input signal digital signal processor (DSP) compressor or limiter, operating in conjunction with a microcontroller, to limit audio signals based on specified threshold values. The innovative design facilitates efficient and adaptive power distribution without the need for a graphical user interface, making it ideal for diverse audio applications.

20 Claims, 6 Drawing Sheets

(56) References Cited

U.S. PATENT DOCUMENTS

| | | | |
|---|---|---|---|
| 6,456,824 B1 | 9/2002 | Butte et al. | |
| 6,670,794 B1 | 12/2003 | Wang et al. | |
| 8,422,692 B1 | 4/2013 | Dygert | |
| 8,570,103 B2 | 10/2013 | Chang | |
| 9,036,835 B2 * | 5/2015 | Buuck | H03F 3/217 330/10 |
| 9,570,984 B2 | 2/2017 | Yang et al. | |
| 9,578,608 B2 | 2/2017 | Shi et al. | |
| 9,647,775 B1 | 5/2017 | Tsutsui et al. | |
| 10,454,302 B2 | 10/2019 | Horvath et al. | |
| 2003/0197557 A1 * | 10/2003 | Pearce | H03F 3/68 330/124 R |
| 2010/0308654 A1 | 12/2010 | Chen | |
| 2011/0267141 A1 | 11/2011 | Hangai et al. | |
| 2013/0251163 A1 * | 9/2013 | Adamson | H04R 29/007 381/58 |
| 2014/0022984 A1 | 1/2014 | Chang | |
| 2017/0104463 A1 | 4/2017 | Gonzalez Esteban et al. | |
| 2021/0120351 A1 * | 4/2021 | Zhao | G06F 1/325 |

FOREIGN PATENT DOCUMENTS

| | | | |
|---|---|---|---|
| CN | 112332478 B | 2/2022 | |
| CN | 110542786 B | 4/2022 | |
| EP | 1487100 A1 * | 12/2004 | H03F 1/0277 |
| KR | 102193181 B1 | 12/2020 | |

OTHER PUBLICATIONS

BOSE: "PowerShare PS404D", Technical Data, May 2023, pp. 1-5.
BOSE: "PowerSpace P4300A", Technical Data, Sep. 2023, pp. 1-5.
International Search Report and Written Opinion, Apr. 8, 2025, International Application No. PCT/US2024/060985, Munich, Germany.

* cited by examiner

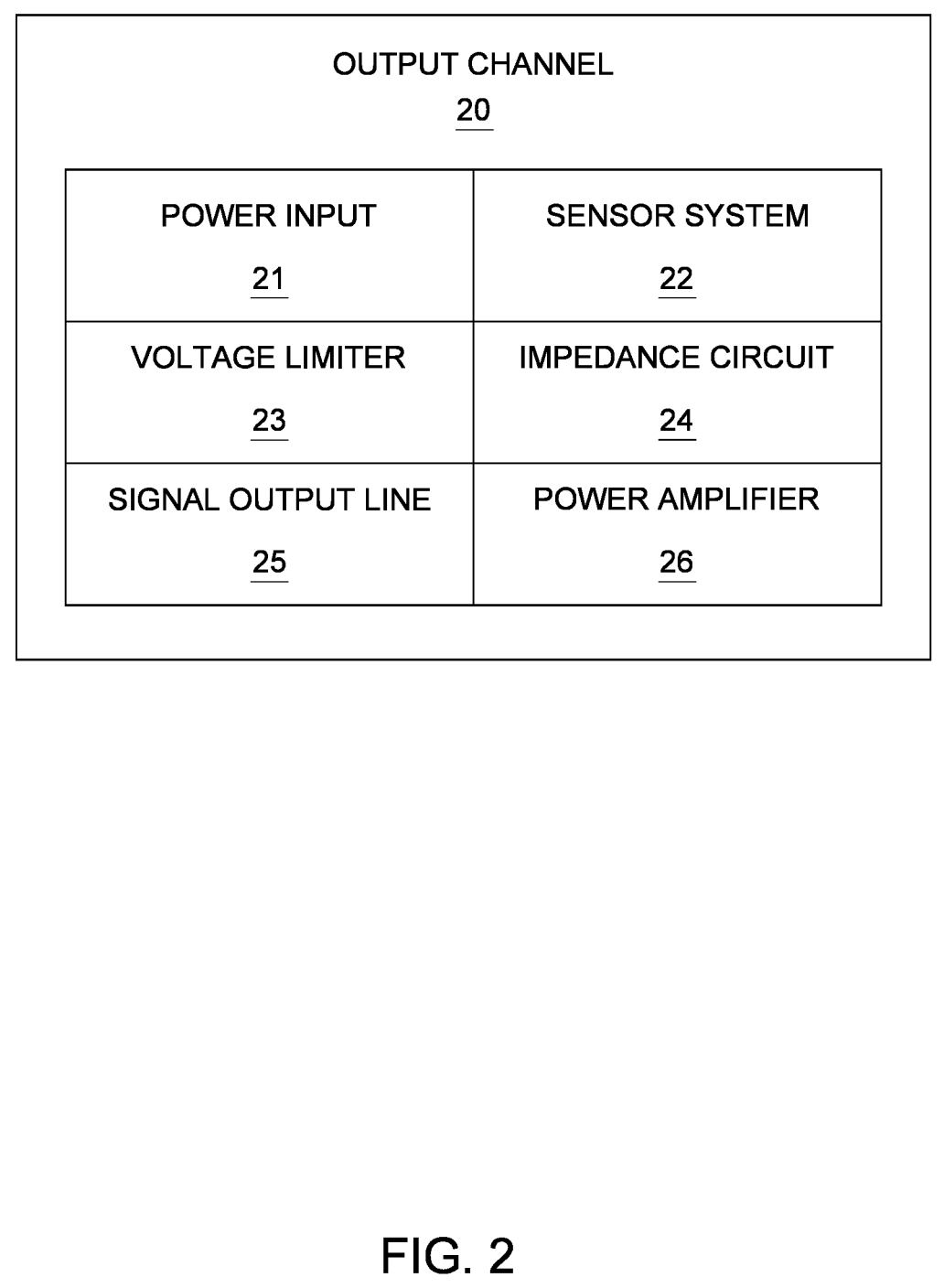

OUTPUT CHANNEL

20

| POWER INPUT | SENSOR SYSTEM |
|---|---|
| 21 | 22 |
| VOLTAGE LIMITER | IMPEDANCE CIRCUIT |
| 23 | 24 |
| SIGNAL OUTPUT LINE | POWER AMPLIFIER |
| 25 | 26 |

FIG. 2

POWER SHARING MULTI-CHANNEL AMPLIFIER

BACKGROUND OF THE INVENTION

Field of the Invention

The present invention relates to power amplifiers, specifically to multichannel amplifiers with power sharing capability.

Description of the Related Art

A power amplifier is an electronic device designed to increase the amplitude of an input signal, typically voltage or current, to drive loads such as speakers, antennas, or transducers, delivering a higher power output. Its primary function is to amplify weak signals from audio, radio frequency (RF), or other electronic sources to levels suitable for driving loudspeakers in audio systems or transmitting signals over long distances in communication systems. Power amplifiers are a fundamental component in various applications, ranging from home entertainment systems and public address systems to wireless communication networks and radar systems.

Taking a low-power electrical signal as its input and producing a higher-power version of the input signal at its output, this amplification process is essential in scenarios where the signal source, like a microphone or an antenna, generates signals too weak to drive the intended load directly. By boosting the signal's power, power amplifiers ensure that the amplified signal can cover longer distances, provide clear audio reproduction, or effectively communicate with other devices. Power amplifiers are integral to the functioning of countless electronic devices, enabling them to deliver robust and high-quality audio or data transmission capabilities.

A multichannel power amplifier is a specialized electronic device capable of amplifying multiple audio or signal channels simultaneously. Unlike single-channel amplifiers, which amplify a single audio source or amplify to a signal output, multichannel power amplifiers have the ability to process and amplify signals from/to multiple sources/outputs independently. Each channel in a multichannel amplifier can receive and amplify distinct signals, allowing for the creation of sophisticated audio setups, such as surround sound systems in home theaters, multizone audio systems in commercial spaces, automotive sound systems (car audio), power sports (side-by-sides, quads, motorcycles), marine audio, or complex sound reinforcement systems in concert venues. These amplifiers are designed to distribute power efficiently among various channels, ensuring consistent and high-quality amplification for each audio source.

Multichannel power amplifiers are widely used in audio and visual systems where multiple speakers or audio zones need to be powered simultaneously. For instance, in home entertainment setups, multichannel amplifiers are used to power speakers placed in different areas of a room to create immersive surround sound experiences. In commercial environments like shopping malls, airports, or restaurants, multichannel amplifiers are employed to drive speakers in various zones, allowing for the independent control of audio content in each area. Additionally, in professional audio setups, such as concert venues or recording studios, multichannel power amplifiers are essential for providing optimal power to different loudspeakers, ensuring clear and powerful sound reproduction across multiple channels.

To properly set up power sharing in a multichannel power amplifier, a professional typically needs to assess the power requirements of the connected speakers or devices in each channel. This involves understanding the power handling capabilities and impedance of the speakers to ensure safe and efficient operation. Next, the professional configures the amplifier settings using a graphical user interface (GUI) or digital signal processing software to adjust voltage and/or impedance for each channel based on the specific requirements of the connected devices. This process involves careful calibration to match the amplifier's output to the speakers' needs, preventing problems such as overloading or distortion. It also requires that the professional have a solid understanding of the associated electrical principles, the setup process, and the GUI or software required to implement a successful install.

Some improvements have been made in the field of power amplifiers. Examples of references related to the present invention are described below in their own words, and the supporting teachings of each reference are incorporated by reference herein:

U.S. Pat. No. 9,578,608, issued to Shi, discloses a power sharing method and a base station, wherein the method comprises the following steps of: according to a power demand of the communication systems of at least one mode among communication systems of different modes sharing a same power amplifier, determining whether to perform power sharing among communication systems of different modes; if it is determined to perform power sharing among communication systems of different modes, adjusting an available power of communication systems of one or more modes therein. According to the embodiments of the present disclosure, when it is determined to perform the power sharing according to the power demands, power sharing is performed among communication systems of different modes, thereby realizing dynamic and flexible power sharing among communication systems of at least two modes.

U.S. Pat. No. 9,570,984, issued to Yang, discloses a circuit for a paralleled power supply module to implement automatic current-sharing in proportion comprises: at least two power supply modules, and an output current feedback loop and an output voltage adjusting loop corresponding to each power supply module. Wherein, the output current feedback loop comprises an output current sample amplifying unit, configured to collect output current of a power supply module and amplify the collected output current into a voltage signal according to an inverse proportion of the output proportion set for each power supply module, and a current-sharing controller unit configured to adjust an output voltage of each power supply module; and the output voltage adjusting loop is configured to compare the output voltage of the current-sharing controller unit with a reference voltage, and control the output voltage of the power supply module to adjust the output current.

U.S. Pat. No. 8,570,103, issued to Chang, discloses a power amplifier module that features both power combining and power sharing capabilities. The proposed flexible power amplifier (PA) module consists of a pre-processor, N PAs, and a post-processor. The pre-processor is an M-to-N wavefront (WF) multiplexer (muxer), while the post processor is a N-to-M WF de-multiplexer (demuxer), where $N \geq M \geq 2$. Multiple independent signals can be concurrently amplified by a proposed multi-channel PA module with a fixed total power output, while individual signal channel outputs feature different power intensities with no signal couplings among the individual signals. In addition to basic configurations, some modules can be configured to feature both functions of parallel power amplifiers and also as M-to-M switches. Other programmable features include configurations of power combining and power redistribution functions with a prescribed amplitude and phase distributions, as well as high power PA with a linearizer.

U.S. Patent Application Publication No.: US20170104463A1, by Gonzalez Esteban, discloses a distributed amplification device with p inputs, p outputs, p amplification paths comprises a redundant reservoir of n amplifiers including n-p back-up amplifiers, an input redundancy ring and an output redundancy ring formed by rotary switches, the input and output redundancy rings sharing the same technology. The internal amplification pathways associated with the n-p back-up amplifiers frame in an interlaced manner the internal amplification pathways associated with the p nominal amplifiers and the amplification paths of the routing configurations each pass through at least five rotary switches. The input and output redundancy rings are topologically and geometrically configured and the family of the routing configurations is chosen such that the electrical lengths of all the paths of one and the same routing configuration of the family are equal.

The inventions heretofore known suffer from a number of disadvantages which include being difficult to use/install/setup, requiring external computing devices or other hardware to operate, being expensive, requiring substantial expertise to install/setup/operate, not being flexible during installation/setup, requiring a large variety of inventory to supply customer needs, being difficult to customize, being difficult to optimize during installation/setup, having limited user usability, and failing to utilize all available power of a power supply.

What is needed is a multichannel power amplifier that solves one or more of the problems described herein and/or one or more problems that may come to the attention of one skilled in the art upon becoming familiar with this specification.

SUMMARY OF THE INVENTION

The present invention has been developed in response to the present state of the art, and in particular, in response to the problems and needs in the art that have not yet been fully solved by currently available power amplifiers. Accordingly, the present invention has been developed to provide a multichannel amplifier having improved power sharing capabilities.

A multichannel amplifier may include a power supply with a specified power output rating. The amplifier may comprise first and second output channels, each with a power amplifier, adjustable voltage limiter, and adjustable impedance circuit, all functionally coupled to the power supply. The output channels may also be equipped with a restriction controller incorporating predefined partial power settings, enabling adjustment of voltage or impedance based on specific restriction modes. These settings may be controlled by a multi-contact switch, with a physical actuator generating different switch modes. Additionally, a microprocessor and associated memory device may calculate partial power settings considering the power output rating, switch mode, and restriction mode, allowing power distribution without a graphical user interface. A sensor system, including temperature, current, and voltage sensors, may provide real-time data to the microprocessor, enabling dynamic adjustments based on sensor data falling outside predefined limits. The amplifier may also feature an audio input linked to a digital signal processor, with the microprocessor and memory device embedded within a microcontroller that limits audio signals to output channels based on thresholds provided by the microcontroller.

Another embodiment of the multichannel amplifier may include a toggle switch controlling restriction modes in the first and second output channels, similar to the previous design. This switch may be coupled with a multi-contact switch determining power distribution balance between output channels, with the microprocessor and memory device calculating partial power settings based on the power output rating, switch mode, and restriction mode. Real-time data from the first output channel may be fed back to the microprocessor through the sensor system, allowing dynamic adjustments within predefined ranges. The amplifier may also incorporate an input signal DSP compressor or limiter, functioning in conjunction with the microcontroller to limit audio signals based on specified threshold values.

A further iteration of the multichannel amplifier may comprise a power supply, an audio input, and first and second output channels equipped with power amplifiers, adjustable voltage limiters, and adjustable impedance circuits. A restriction controller with predefined partial power settings may be present, and a multi-contact switch may regulate power distribution balance between the output channels. The microcontroller, embedded within the amplifier, calculates partial power settings by considering the power output rating, switch mode, and restriction mode. Additionally, an input signal DSP compressor or limiter, connected to the audio input and output channels, may limit audio signals based on thresholds set by the microcontroller, ensuring efficient audio output.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims or may be learned by the practice of the invention as set forth hereinafter.

BRIEF DESCRIPTION OF THE DRAWINGS

In order for the advantages of the invention to be readily understood, a more particular description of the invention briefly described above will be rendered by reference to specific embodiments that are illustrated in the appended drawing(s). It is noted that the drawings of the invention are not to scale. The drawings are mere schematics representations, not intended to portray specific parameters of the invention. Understanding that these drawing(s) depict only typical embodiments of the invention and are not, therefore, to be considered to be limiting its scope, the invention will be described and explained with additional specificity and detail through the use of the accompanying drawing(s), in which:

FIG. 2 is a module diagram of an output channel of a multichannel power amplifier, according to one embodiment of the invention;

DETAILED DESCRIPTION OF THE INVENTION

Figure 1:
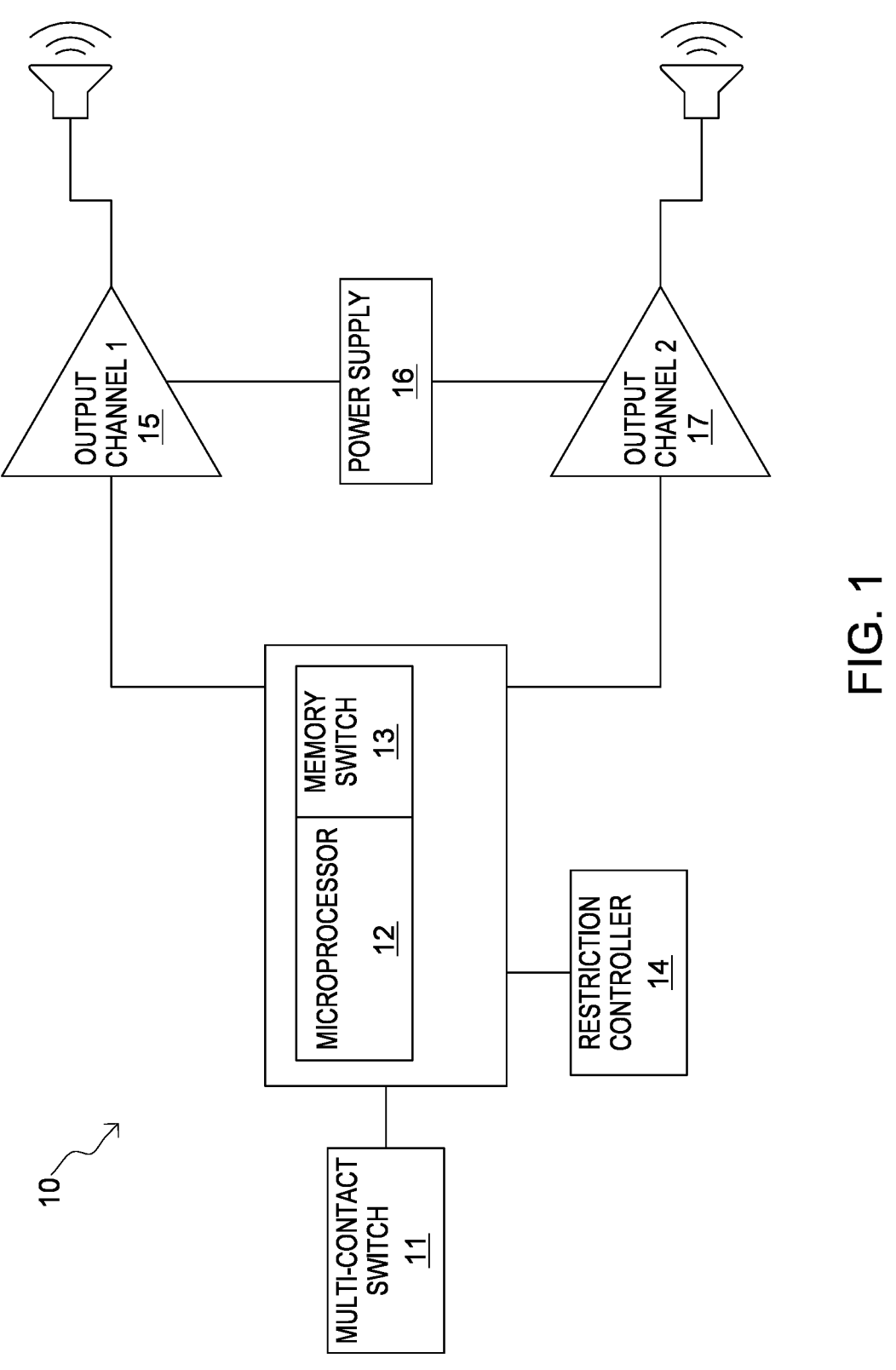
FIG. 1 is a block diagram showing a multichannel power amplifier, according to one embodiment of the invention.

For the purpose of promoting an understanding of the principles of the invention, reference will now be made to the exemplary embodiments illustrated in the drawing(s), and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to an "embodiment," an "example" or similar language means that a particular feature, structure, characteristic, or combinations thereof described in connection with the embodiment is included in at least one embodiment of the present invention. Thus, appearances of the phrases an "embodiment," an "example," and similar language throughout this specification may, but do not necessarily, all refer to the same embodiment, to different embodiments, or to one or more of the figures. Additionally, reference to the wording "embodiment," "example" or the like, for two or more features, elements, etc. does not mean that the features are necessarily related, dissimilar, the same, etc.

Each statement of an embodiment, or example, is to be considered independent of any other statement of an embodiment despite any use of similar or identical language characterizing each embodiment. Therefore, where one embodiment is identified as "another embodiment," the identified embodiment is independent of any other embodiments characterized by the language "another embodiment." The features, functions, and the like described herein are considered to be able to be combined in whole or in part one with another as the claims and/or art may direct, either directly or indirectly, implicitly or explicitly.

As used herein, "comprising," "including," "containing," "is," "are," "characterized by," and grammatical equivalents thereof are inclusive or open-ended terms that do not exclude additional unrecited elements or method steps.

"Comprising" is to be interpreted as including the more restrictive terms "consisting of" and "consisting essentially of."

FIG. 1 is a block diagram showing a multichannel power amplifier 10, according to one embodiment of the invention. There is shown a combined microprocessor 12 and memory device 13 functionally coupled to a pair of output channels 15, 17 as well as a multi-contact switch 11 and a restriction controller 14. A power supply 16 is functionally coupled to each of the output channels 15, 17. The illustrated multi-channel power amplifier 10 shares power from the power supply 16 between the first and second output channels 15, 17 based on a present switch mode of the multi-contact switch 11 in combination with settings applied through the restriction controller 14. Advantageously, an installer may simply set the restriction controller 14 to an appropriate restriction and then set the multi-contact switch 11 to a desired power sharing mode and thereby setup the power sharing of the multichannel amplifier 10 without utilizing complicated and expensive GUI or software settings or requiring the training needed to use the same. While the illustrated figure shows the output channels 15, 17 coupled to speakers, it is understood that the illustrated multichannel power amplifier output channels 15, 17 may be functionally coupled to non-speaker output lines and even non-audio output lines, such as but not limited to broadcasting and television, wireless communication, radar systems, medical imaging, industrial automation, scientific research, aerospace and defense, satellite communication, test and measurement, wireless LANs (local area networks), research laboratories, energy and power systems, and environmental monitoring.

The illustrated combined microprocessor 12 and memory device 13 allows for processing instructions from memory in association with received signals and thereby also allows for the sending of commands to other components of the system (e.g. the output channels). The memory device may include machine readable instructions to produce a second partial power setting based on a combination of a power output rating of the power supply, a present switch mode of the multi-contact switch, and a present restriction mode of the restriction controller.

Such may be present in the form of a table of values, especially wherein the permutations of the present switch mode, power output rating, and restriction mode are fairly limited. As a non-limiting example, wherein the power output of the power supply is fixed, there may be only a single power output rating to combine with the various permutations of the present switch mode and the restriction mode. Further, it may be that the restriction mode for an output channel may be limited to four modes of restrictions. In that case, the table would need to hold four times as many entries as there are present switch modes. Wherein there are four present switch modes (e.g. See "Load Select" switches in FIG. 3) the table would hold sixteen second partial power settings and would select from the table based on the received signals from the multi-contact switch and the restriction controller. That second partial power setting would be provided as a command to the associated output channel which would then restrict current and/or voltage accordingly, thereby only taking the allotted power according to the multi-contact switch setting.

Alternatively, the memory device 13 may include instructions for calculating a second partial power setting based on the present switch mode, power output rating, and restriction mode. Such calculation would generally include utilizing electrical theory including but not limited to primarily using Ohms Law (e.g. Current=Voltage/Resistance and its permutations) and Watts Law (e.g. Power=Voltage×Current and Power=Voltage^2 divided by Resistance) but also may utilize Kirchoff's Current and Voltage Laws wherein circuits within the system (or even outside the system) may be modeled within the memory device. As a non-limiting example, wherein an output channel has the following restriction settings: 2 Ohm and 70 Volt and the present switch mode of the multi-contact switch assigns 100 Watts to that output channel, the second partial power setting would be set to limit the impedance/voltage such that 7.07 amps of current (e.g. limiting the Voltage to 14.14 Volts so that the 2 Ohm system does not carry more than 7.07 amps). It is understood that one skilled in the art of producing multichannel power amplifiers would be able to properly program the memory device to produce correct second partial power settings based on modern electrical theory and the known inputs of the present system.

The illustrated microprocessor 12 and associated memory device 13 includes at least two inputs and an output. There is a power share input functionally coupled to the multi-contact switch such that the present switch mode thereof is received by the microprocessor/memory device. There is a switch system input functionally coupled to receive the present restriction mode from the restriction controller. There is a power setting output functionally coupled to each of the first and second output channels such that the second partial power setting from the memory device restricts the voltage and/or impedance of the first output channel via its associated adjustable voltage limiter or adjustable impedance circuit and also restricts the voltage or impedance of the second output channel via its associated adjustable voltage limiter or adjustable impedance circuit.

A microprocessor is a central processing unit (CPU) generally contained within a single integrated circuit (IC) or chip, serving as the brain of a computer or electronic device. It generally processes instructions from memory, performs arithmetic and logic operations, and/or manages input/output functions, enabling the device to execute tasks and run software applications. They interpret and execute instructions, enabling the functionality of complex software programs and facilitating communication between hardware components. Examples of popular microprocessors include Intel's Core series and AMD's Ryzen series for computers, as well as ARM processors commonly found in mobile devices like smartphones and tablets.

A memory device, in the context of computing, is an electronic component used to store data and instructions that a computer's central processing unit (CPU) can access and manipulate. These devices hold temporary or permanent data that the CPU requires for processing tasks. In the realm of direct coupling to CPUs, Random Access Memory (RAM) is a prominent example. RAM is volatile memory, meaning it loses its stored information when the power is turned off but provides fast access times, allowing the CPU to swiftly retrieve and modify data during operations. Another type is Cache Memory, which is a smaller, high-speed memory unit located directly on the CPU chip itself. It stores frequently accessed data and instructions, enhancing the processor's speed by reducing the time it takes to fetch information from the main memory (RAM). Additionally, Read-Only Memory (ROM) is a non-volatile memory type containing permanent instructions that the CPU accesses during the boot-up process. Examples of these memory devices include Dynamic RAM (DRAM), Static RAM (SRAM), and Flash Memory, each with specific characteristics tailored to various computing needs.

The illustrated power supply 16 provides power to the multichannel amplifier 10 according to its power output rating (generally in Watts) and is functionally coupled to each of the illustrated output channels such that its power may be provided thereto. The power supply 16 may also be functionally coupled to the microprocessor and/or memory device such that the power rating of the power supply may be provided thereto and stored therein. Such may be useful where the power supply has a selectably changeable power rating, such as may be the case with certain types of flyback power supplies. The microprocessor 12 may and provide instructions thereto and may receive other data therefrom (e.g. sensor data similar to that which may come from the output channels).

The illustrated output channels 15, 17 are functionally coupled to each of the power supply 16 and the microprocessor 12. They are also functionally coupled to the illustrated audio lines such that output from the output channels 15, 17 is sent to the associated audio lines. The output channels 15, 17 each receive power from the power supply 16 and instructions from the microprocessor 12. The input to the amplifier system (e.g. an audio signal) is not shown, but could be directly coupled to each output channel or could run through the microprocessor. See FIG. 6 for another alternative signal input configuration. See FIG. 2 for components that may be included within an output channel, including current/voltage regulation.

An output channel of a power amplifier is a dedicated pathway through which amplified signals are delivered to external devices such as speakers, transducers, or other audio equipment. Within the power amplifier, each output channel typically consists of a power amplifier circuit responsible for amplifying the incoming electrical signal, increasing its amplitude to a level suitable for driving the connected load. Additionally, output channels may include adjustable components like voltage limiters and impedance circuits, allowing customization of the output signal characteristics based on the requirements of the connected devices. These channels serve as the bridge between the power amplifier and external equipment, ensuring that the amplified audio or signal is accurately and efficiently transmitted, providing clear and robust sound reproduction or signal transmission. Some examples include: speaker outputs, transducer outputs, motor drive outputs, antenna outputs, subwoofer outputs, headphone outputs, line outputs, feedback outputs, and auxiliary outputs.

The illustrated multi-contact switch 11 allows an installer to interface with the amplifier 10 to determine the power sharing between the output channels 15, 17. The illustrated switch 11 may have a physical actuator (e.g. toggle switches, push-button switches, rocker switches, rotary switches, slide switches, momentary switches, tactile switches, DIP switches, membrane switches, lever switches, key switches, and mercury switches). The multi-contact switch 11 produces a present switch mode from a plurality of switch modes. It may be that a present switch mode may include power share information for multiple output channels at the same time (see FIGS. 3 and 4). Power share information may be simply switch position information that is then interpreted by the microprocessor to be power sharing settings. It may be that the multi-contact switch 11 is a single switch that includes power share designations and/or produces an associated signal corresponding to additive balance of power distribution (i.e. the sum of the total power distribution adds to the total available power based on the power rating of the power supply) between the first and second output channels.

As a non-limiting example, it may be that position 1 of the switch 11 may correspond to equal sharing of the power between two channels, while position two of the switch 11 may be power sharing where channel one is receiving 50 Watts more than an equal distribution and channel two is receiving 50 Watts less than equal distribution. The switch 11 may be labeled with permanent markings or may include a graphical display that is in communication with the microprocessor so that the displayed sharing information matches with the sharing configuration of the present switch mode that the microprocessor is utilizing.

The illustrated restriction controller 14 provides control instructions (i.e. first partial power settings, such that each output channel is restricted to a particular voltage or imped-ance requirement identified by a present restriction mode, e.g. if the restriction mode is set to 2 Ohms, the micropro-cessor will utilize that maximum in calculating its second partial power setting) for limiting voltage/impedance of each associated output channel. It is functionally coupled to the microprocessor/memory device 12, 13 such that control instructions from the restriction controller 14 are available for utilization. Such controller 14 may include physical switches (e.g. generally dip switches or other toggle switches) that are set to known values for the associated output channel by the professional performing the setup/install. Alternatively, the restriction controller 14 may read a value from an attached output line if the attached output line has the capability to provide that information. It may be that the first partial power setting is fixed to a particular value or particular initial value and then may change by instructions from the microprocessor based on interaction with sensor data.

As a non-limiting example, the following settings are common load/voltage requirements for audio implementa-tions (other implementations may have differing require-ments, but will generally be known based on the intended implementation):

Car Audio—Have low impedance load requirements of 1-ohm, 2-ohm, and 4-ohm,

Home Audio—Have low impedance load requirements of 4-ohm and 8-ohm

Commercial Audio—Has both low and Constant Voltage (high impedance) load requirements of 2, 4 & 8-ohm and 70V/100V.

In operation, then illustrated system provides a manual mechanical method for power sharing between two amplifier channels sharing the power. It is an amplifier with a power supply with a given value where the power (e.g. an amplified audio signal) can be directed to either channel or shared between both channels. It includes a single mechanical (e.g. rotary, slide, or variable pot) switch to determine the value that you want to select and a microprocessor/microcontroller coupled to a current limiter to control the current delivered (e.g. with a DSP (digital signal processor) limiter to limit input level signal). The microcontroller controls the output channel amplification in response to selection of the mechanical switch. It may be that in a single control one is adjusting the power sharing of both channels.

Advantageously, an installer with very little training and expertise may be able to setup and install a multichannel power amplifier with power sharing capabilities with only the knowledge of the desired power sharing mode and an assigned load impedance for each channel. Further, the purchaser of the system need not pay extra for a GUI or software interface for the multichannel power amplifier, thereby reducing the cost required to produce such a system.

The installation will also be faster and less prone to prob-lems and errors, such as but not limited to:

Overloading and Damage: If the power amplifier channels are not balanced correctly, some channels might receive more power than they can handle. This can lead to overloading, overheating, and ultimately damaging the connected speakers or amplifiers, rendering them unusable.

Distorted Audio: Incorrect power sharing can cause dis-tortion in the audio output. When amplifiers are not distributing power evenly among channels, it can result in clipped or distorted sound, diminishing the overall audio quality and clarity.

Inefficient Power Usage: Improper setup might lead to inefficient use of power. Some channels might receive too much power while others are underutilized, leading to wasted energy and potentially higher operating costs in the long run.

Inconsistent Performance: Different speakers or audio zones might receive varying power levels, leading to an inconsistent audio experience. In venues like theaters or concert halls, where uniform sound quality is crucial, this can result in an unsatisfactory audience experience.

System Instability: Improper power sharing can cause the amplifier to operate erratically. This instability might result in unexpected shutdowns or interruptions during crucial moments, leading to disruptions in audio play-back.

Shortened Equipment Lifespan: Continuous operation with improper power distribution can put excessive stress on the equipment, potentially shortening its lifes-pan. Over time, this could lead to frequent repairs or replacements, increasing maintenance costs.

Further, the illustrated amplifier allows a manufacturer/supplier to not have to stock multiple SKUs of amplifier with various power levels or amplifiers with expensive GUI/software systems and interfaces. It also allows one to tailor the amplifier power output to installation requirements by steering the power in a desired configuration and further, one is able to easily change that setting if the system setup changes.

According to one embodiment of the invention, it may be that amplifier power sharing applies to two amplifier chan-nels. These amplifiers power levels may be determined by four main components: power supply current and voltage levels to obtained the rated loads; a microcontroller to control/monitor voltage, current, and input signal levels; output stage voltage and current regulator circuits, and a control switch (e.g. a multi-contact switch displaying a plurality of power sharing modes).

It may be that the amplifier power supply is connected to each amplifier channels output stage via a fixed maximum DC voltage and maximum current level. It may be that both amplifier channels output voltage and current are controlled/monitored independently. This may allow each channel to achieve an assigned power level (i.e. that of the present power sharing mode of the control switch) regardless of the assigned load impedance. It may be that amplifier model specifications determines the power supply requirements for voltage and current. It may be that the microcontroller monitors and controls each of the channels power supply voltage, current and input signal required to achieve the user settings.

It may be that each of the two-amplifier channels has two user select configuration settings, load selection (i.e. from a restriction controller, e.g. in Voltage or Impedance) and amplifier channel maximum power (i.e. from a multi-contact switch, e.g. in Watts). These configuration switch settings may be sent to the microcontroller and the microcontroller sends the required voltage and current commands to each amplifier channel to achieve the present power share mode setting(s). It may be that the amplifier output topology is Class D, which is highly efficient. Further, Class D amplifiers by design, allow for each amplifier channels output current and output voltage to be regulated to achieve the user configured power share and load select settings. It may be that each channel incorporates independent circuitry to regulate the current and voltage requirements.

Further, to prevent the end user from over driving the amplifier channel, a input signal DSP Compressor/limiter may be used. A DSP compressor/limiter threshold may be set to allow a maximum audio input signal into the amplifier to achieve the user selected power share power level. It may be that the DSP compressor/limiter gets it settings from a microcontroller.

FIG. 2 is a module diagram of an output channel 20 of a multichannel power amplifier, according to one embodiment of the invention. There is shown an output channel 20 having a power input 21, a sensor system 22, a voltage limiter 23, an impedance circuit 24, a signal output line 25, and a power amplifier 26. The illustrated output channel 20 is capable of amplifying an input signal for distribution over the signal output line 25 by operation of the power amplifier 26 utilizing power from the power input 21 while limiting the power utilized via the voltage limiter 23 and/or impedance circuit 24. The sensor system 22 monitors operational characteristics of the output channel 20, such as actual output voltage, current, and temperature and may feed that information elsewhere in the associated system.

The signal output line 25 is functionally coupled to the power amplifier 26 and provides the amplified signal therefrom as an output line 25 accessible to whatever downstream system is intended to utilize that amplified signal. The signal output line 25 is the pathway through which the amplified audio signals are transmitted to external devices like speakers or transducers. These output lines carry the amplified audio signals from the power amplifier to the connected devices, enabling them to produce sound. Properly configured output lines ensure accurate signal transmission and high-quality audio output. For example, in a concert setup, the signal output lines from the amplifier distribute the amplified audio signals to different speakers strategically placed throughout the venue, delivering clear and powerful sound to the audience.

The illustrated power input 21 provides a coupling (i.e. electrical connection) between a power supply outside of the output channel 20 and the power amplifier 26 and associated circuitry (e.g. voltage limiter 23 and impedance circuit 24). Such may also include connective hardware to functionally couple those components together in a way that they function together to produce intended results.

The illustrated sensor system 22 includes one or more sensors that are functionally coupled to one or more components of the output channel 20 such that data is generated thereby. Such may include one or more voltage, current, or temperature sensors, which may be coupled to the signal output line, the power amplifier, the voltage limiter, and/or the impedance circuit. These sensors continuously monitor the amplifier's internal conditions and the connected output devices. By providing real-time data, the sensor system 22 enables the amplifier to adjust its settings dynamically. For instance, if a channel is operating at high temperatures, the sensor system 22 can trigger adjustments to prevent overheating, ensuring the amplifier operates within safe parameters. Data therefrom may be fed (e.g. in real-time) to other parts of the system so that decisions may be made (e.g. by a microprocessor/microcontroller) regarding changes to command instructions. Further, such data may be recorded and stored in one or more memory devices.

It may be that an associated memory device includes machine readable instructions for altering the second partial power setting based on data from the sensor system 22 being outside of a predefined range. Such may be to further limit voltage or increase impedance in an output channel where a high temperature is detected or where an actual current/voltage on the signal output line is out of range of the intended range. Such may be to shut off the power amplifier instead of limiting the amplification.

The illustrated voltage limiter 23 (aka Voltage Clamp) is functionally coupled to the power amplifier such that voltage may be limited therein. It may be that the voltage limiter is an adjustable voltage limiter, such that the voltage may be adjustably limited. A voltage limiter 23 restricts the voltage output to a predefined level. It functions as a protective mechanism, preventing the connected devices from receiving excessive voltage that could damage them. Voltage limiters are adjustable and can be customized for each channel. For example, in a 4-channel amplifier, each channel might have its voltage limiter set to limit the output voltage to 50V, ensuring that connected speakers or devices receive a safe and regulated power supply. Such may be implemented via various circuit configurations known to those skilled in the art that function as voltage limiters, and/or inclusion of Zener diodes, varistors, and/or gas discharge tubes within the circuitry.

The illustrated impedance circuit 24 is functionally coupled to the power amplifier such that impedance may be limited therein. It may be that the impedance circuit 24 is an adjustable impedance circuit, such that the impedance may be adjustably limited. The impedance circuit 24 limits the electrical impedance, ensuring that the connected speakers or devices match the amplifier's output impedance. Impedance matching is vital for efficient power transfer and preventing signal reflections. Different speakers have different impedance ratings, such as 4 ohms or 8 ohms. The impedance circuit adjusts the amplifier's output impedance to match that of the connected devices, maximizing power transfer and optimizing sound quality. Such may be implemented via various and plethoric circuitry configurations known to those of ordinary skill in the art that selectably alter the impedance of a line which generally include transformers; and/or adjustable networks of lumped resistance, capacitance, and inductance in various configurations along with gates/switches to selectably incorporate the same as desired.

The illustrated power amplifier 26 is functionally coupled to a power supply via the power input 21. The power amplifier 26 is the core component responsible for amplifying the input signals. It receives low-power signals and generally significantly boosts their amplitude to drive the connected speakers or devices. Power amplifiers utilize transistors or other amplifying components to perform this amplification process.

Figure 3:
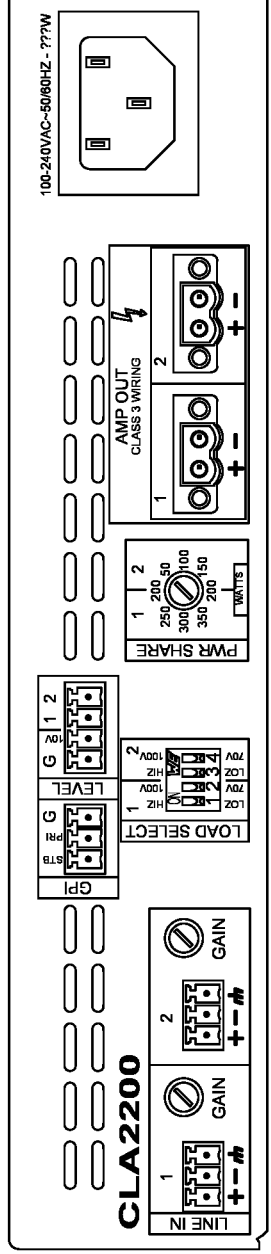
FIGS. 3 and 4 illustrate prophetic faceplates of a multi-channel power amplifier, according to various embodiment of the invention.
Figure 4:
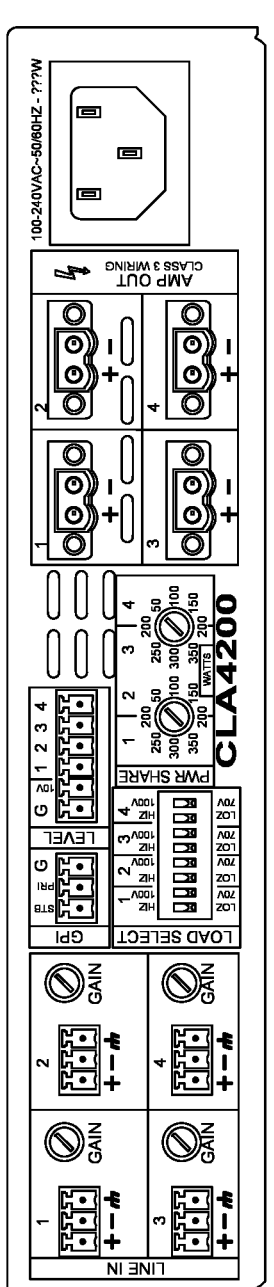

FIGS. 3 and 4 illustrate prophetic faceplates of a multichannel power amplifier, according to various embodiment of the invention. One each faceplate there is shown a LOAD SELECT region and a PWR SHARE region, each corresponding to physical switches that are part of a restriction system (labeled as LOAD SELECT) and multi-contact switch (labeled as PWR SHARE) that an installer may utilize the configure the associated multichannel power amplifier. The illustrated faceplates also display input lines (labeled as LINE IN) and signal output lines (labeled as AMP OUT). The faceplate in FIG. 3 is for an amplifier capable of receiving dual input and outputting to two output channels. The faceplate in FIG. 4 is for an amplifier capable of receiving four inputs and outputting to four output channels. It includes two multi-contact switches to distribute power independently between two sets of output channels. In FIG. 4, Channels 1 and 3 are each set to 350 Watts and Channels 2 and 4 are set to 50 Watts each.

Figure 5:
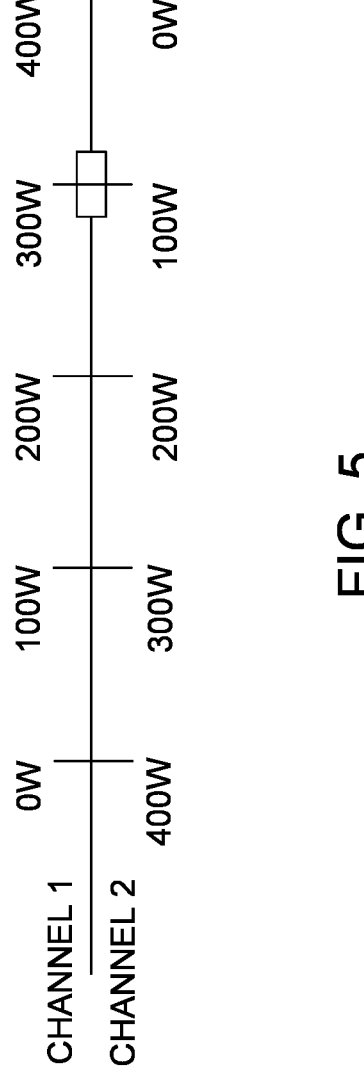
FIG. 5 illustrates a prophetic multi-contact slide switch of a multichannel power amplifier, according to one embodiment of the invention.

FIG. 5 illustrates a prophetic multi-contact slide switch of a multichannel power amplifier, according to one embodiment of the invention. The illustrated slide switch includes indicators at various switch positions that simultaneously indicate intended power distribution between two channels. In the first position on the far left, Channel 1 receives 0 Watts while Channel 2 receives 400 Watts. Each subsequent position shifts, in 100 Watt increments, power from Channel 2 to Channel 1, with the final position on the far right indicating 400 Watts for Channel 1 and 0 Watts for Channel 2. The selector showing the present selection mode indicates 300 Watts for Channel 1 and 100 Watts for Channel 2. Accordingly, the switch itself would provide information to a coupled microprocessor/microcontroller such that the same would utilize that intended power distributions (300 W/100 W) in its determination of the appropriate second partial power setting.

Figure 6:
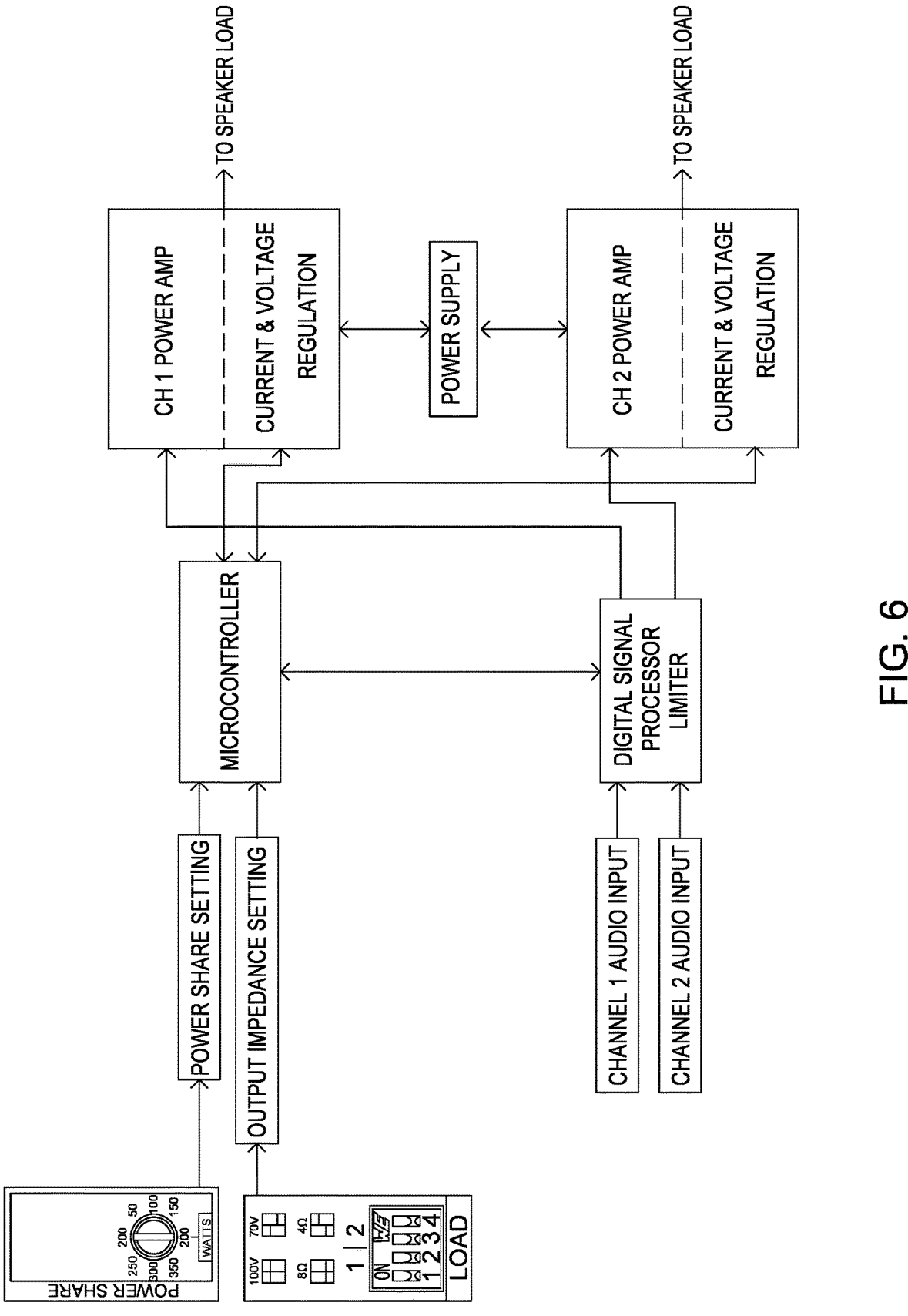
FIG. 6 is a block diagram showing a multichannel power amplifier, according to one embodiment of the invention.

FIG. 6 is a block diagram showing a multichannel power amplifier, according to one embodiment of the invention. The illustrated multichannel power amplifier shows a dual channel input coupled to a digital signal processor limiter that is in communication with a microcontroller that manages power distribution of the amplifier. The illustrated amplifier protects from input signals that may over drive the intended output signals while still allowing for selectable power sharing without needing a GUI or software/programming interface.

The illustrated microcontroller is functionally coupled to the digital signal processor limiter (which may be operated by an associated digital signal processor (DSP), the power share setting (multi-contact switch), the output impedance setting (restriction controller), and each of the output channels (CH 1 Power Amp and associated Current and Voltage Regulation and Ch 2 Power Amp and associated Current and Voltage Regulation) includes a microprocessor and associated memory device. A microcontroller is generally a compact integrated circuit that contains a central processing unit (CPU), memory, and input/output peripherals. It functions as the brain of embedded systems, controlling various tasks within electronic devices. Microcontrollers process instructions, read inputs from sensors, and execute programmed algorithms, making decisions based on the received data.

The illustrated Digital Signal Processor limiter may limit a maximum audio signal from the digital signal processor to each of the first and second output channels based on a threshold value from the microcontroller. Such is generally a digital signal processing algorithm designed to prevent audio signals from exceeding a specified amplitude or level, avoiding distortion or damage to audio equipment. It works by detecting signal peaks and reducing their amplitudes to a predefined limit. In live sound applications, a DSP limiter can protect speakers from receiving excessively loud signals that could harm the speakers or disrupt the audio quality. For example, in a concert setup, a DSP limiter can ensure that the amplified audio signals sent to the speakers do not exceed safe levels, preventing distortion and ensuring clear sound projection. Such may be implemented utilizing a digital signal processor. A DSP compressor may also be used.

A DSP compressor is a digital signal processing technique used to control the dynamic range of audio signals. It reduces the amplitude of loud signals while boosting softer signals, ensuring a more consistent output level. Compressors are widely used in audio production to balance audio levels and enhance clarity. For instance, in a recording studio, a DSP compressor can be applied to vocals, reducing the volume of loud passages and enhancing the overall balance of the recording. This process helps maintain a consistent audio level, making it easier to mix and ensuring a polished final sound.

A digital signal processor is a specialized microprocessor designed for efficiently processing digital signals such as audio, video, or sensor data. Unlike general-purpose microcontrollers, DSPs are optimized for mathematical calculations and signal manipulation, making them ideal for tasks like audio processing and digital communications. DSPs can perform complex algorithms in real-time, enhancing sound quality or enabling noise reduction in audio systems. For instance, in noise-canceling headphones, a DSP processes incoming audio signals, identifies background noise, and generates anti-noise signals to cancel unwanted sounds, providing a quieter listening experience. It may be that the DSP includes one or more of a VCA (voltage control amplifier) and a traditional analog limiter/compressor.

Figure 7:
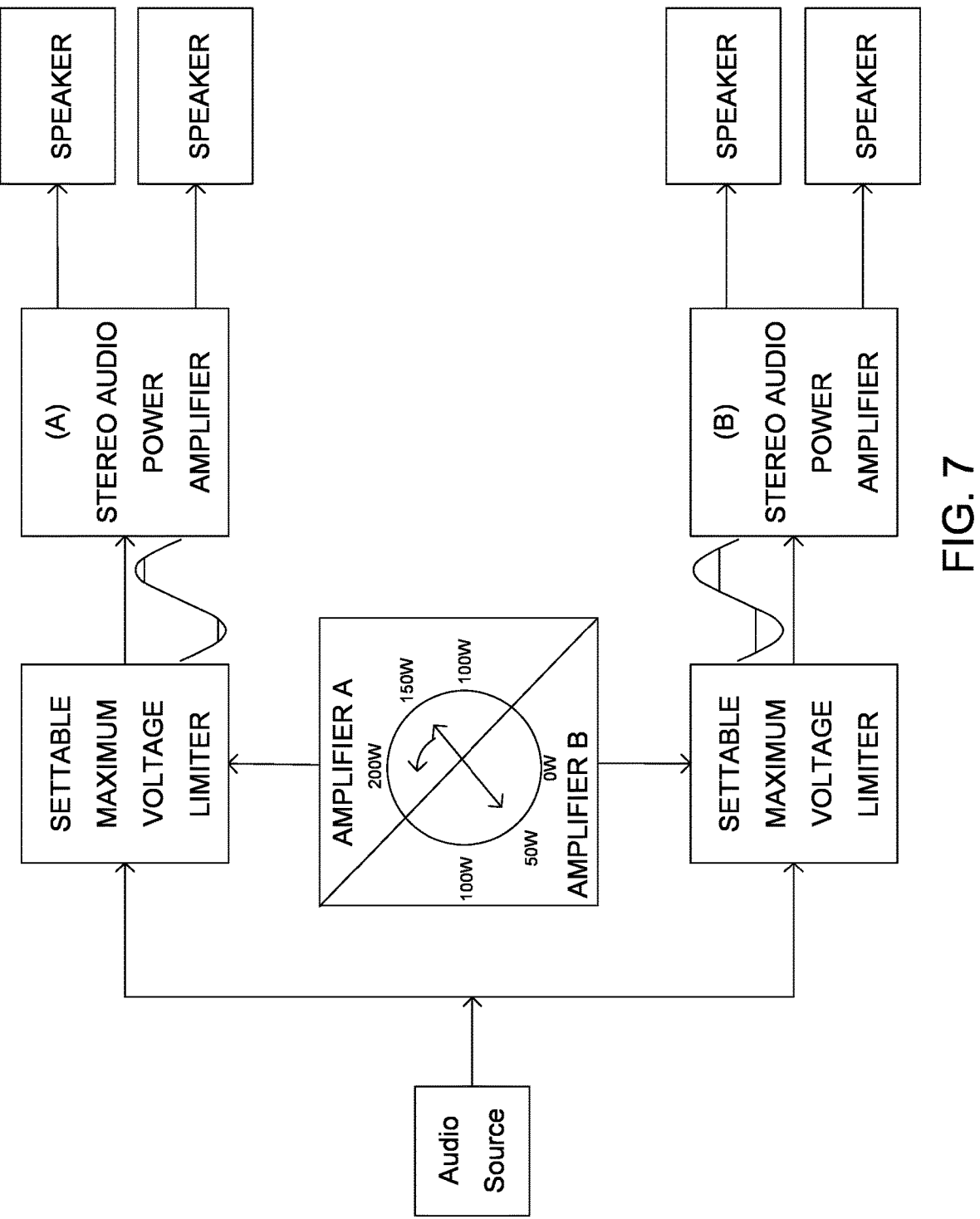
FIG. 7 is a block diagram showing a multichannel power amplifier, according to one embodiment of the invention.

FIG. 7 is a block diagram showing a multichannel power amplifier, according to one embodiment of the invention. There is shown a power supply functionally coupled to each of first and second output channels each having a fixed impedance and each functionally coupled to an associated adjustable voltage limiter, wherein both adjustable voltage limiters are functionally coupled to a single multi-contact switch having a physical actuator with power output designations for the first and second output channels. Advantageously, the illustrated multichannel amplifier allows for power sharing between the first and second output channels without requiring computing systems and especially computing systems needing programming or graphical user interfaces. The illustrated amplifier is far less expensive than existing multichannel amplifiers with power sharing capability and is easier to use and install.

The illustrated first and second output channels have a fixed impedance and each feed a plurality of speaker lines. The two illustrated channels may have the same impedance, one to the other, or a fixed impedance that is diverse from the other channel. As a non-limiting example, in car audio implementations a 4-ohm impedance is very typical and so it may be that both channels are fixed to having 4 ohms of impedance. Alternatively, one line may be fixed to 4 ohms while the other is fixed to 8 ohms or 16 ohms. This fixed impedance may be achieved by a circuit having series or parallel resistors the limit the impedance accordingly. The amplifier may include such circuitry within the channel itself or such impedance fixing circuitry may be included in or after an associated output line (e.g. between the channels power amplifier and the output connector used to couple the output channel to the associated speaker line(s). circuitry and setups for fixing impedance to desired ratings is well-known by one of ordinary skill in the art.

The illustrated adjustable voltage limiter of each output channel is functionally coupled to the multi-contact switch such that switch settings of the same simultaneously control the particular voltage limit of each adjustable voltage limiter. Such may be accomplished by including the multi-contact switch in the selector circuitry of each limiter in a manner that predictably changes the limit based on the known fixed impedance of the associated channel and the known power rating of the power supply.

The illustrated multi-contact switch includes a physical actuator with power output designations for the first and second output channels (e.g. 200 W, 150 W, . . . 0 W). Further, the illustrated multi-contact switch produces a present switch mode from a plurality of switch modes such that, being functionally coupled to each of the adjustable voltage limiters of the first and second output channels, the present switch mode selects a specific voltage limit for each of the first and second output channels thereby limiting power output through each of the first and second output channels to associated displayed power output designations without requiring a graphical user interface. The multi-contact switch may be an adjustable potentiometer that selectably produces an array of particular resistance values, which then are utilized by the associated circuitry to establish particular voltage limits in the voltage limiters.

The illustrated multichannel amplifier may include an audio input functionally coupled to a digital signal processor which is functionally coupled to each of the first and second output channels. It may also include a microprocessor and an associated memory device that is functionally coupled to the digital signal processor. It may be that the digital signal processor includes an input signal DSP compressor or an input signal DSP limiter functionally coupled to the microprocessor that limits a maximum audio signal from the digital signal processor to each of the first and second output channels based on a threshold value from the memory device.

There may also be included a sensor system functionally coupled to each of the first and second output channels to observe a state there and functionally coupled to the microprocessor to provide state information thereto, and wherein the microcontroller is functionally coupled to each of the adjustable voltage limiters such that the microprocessor may further restrict voltage on a state condition. It may be that the state is a voltage, current, or temperature.

It is understood that the above-described embodiments are only illustrative of the application of the principles of the present invention. The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

For example, although the illustrated figures show multi-contact switches that only control two output channels at a time, it is understood that such switches could be labeled and provide instructions for more than two output channels at a time.

Additionally, although the figures illustrate two or more signal inputs, it is understood that a multichannel amplifier could have just a single signal input.

Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims. Further, it is contemplated that an embodiment may be limited to consist of or to consist essentially of one or more of the features, functions, structures, methods described herein.

What is claimed is:

1. A multichannel amplifier, comprising:
   a. a power supply having a power output rating;
   b. first and second output channels each functionally coupled to the power supply and each including:
      i. a power amplifier functionally coupled to the power supply;
      ii. an adjustable voltage limiter functionally coupled to the power amplifier such that voltage may be adjustably limited therein; and
      iii. an adjustable impedance circuit functionally coupled to the power amplifier such that impedance may be adjustably limited therein;
   c. a restriction controller includes a set of predefined set first partial power setting such that each output channel is restricted to a particular voltage or impedance requirement identified by a present restriction mode;
   d. a multi-contact switch having a physical actuator, the multi-contact switch producing a present switch mode from a plurality of switch modes; and
   e. a microprocessor and associated memory device includes machine readable instructions to produce a second partial power setting based on a combination of the power output rating, the present switch mode, and the present restriction mode, the microprocessor and associated memory device including:
      i. a power share input functionally coupled to the multi-contact switch such that the present switch mode thereof is received by the microprocessor;
      ii. a switch system input functionally coupled to receive the present restriction mode; and
      iii. a power setting output functionally coupled to each of the first and second output channels such that the second partial power setting from the memory device restricts the voltage or impedance of the first output channel via its associated adjustable voltage limiter or adjustable impedance circuit and also restricts the voltage or impedance of the second output channel via its associated adjustable voltage limiter or adjustable impedance circuit, thereby selectably sharing power output of the power supply therebetween without use of a graphical user interface.

2. The multichannel amplifier of claim 1, wherein the machine readable instructions include a table of partial power settings that match with specific permutations of power output ratings and voltage/impedance requirements.

3. The multichannel amplifier of claim 1, further comprising a sensor system feeding real-time data from the first output channel back to the microprocessor.

4. The multichannel amplifier of claim 3, wherein the sensor system includes at least one of a temperature sensor, a current sensor, and a voltage sensor functionally coupled to the first output channel such that corresponding data from the first output channel is fed to the microprocessor.

5. The multichannel amplifier of claim 4, wherein the memory device includes machine readable instructions for altering the second partial power setting based on data from the sensor system being outside of a predefined range.

6. The multichannel amplifier of claim 1, wherein the restriction controller includes a physical toggle switch that toggles between a pair of restriction settings.

7. The multichannel amplifier of claim 1, further comprising an audio input functionally coupled to a digital signal processor which is functionally coupled to each of the first and second output channels.

8. The multichannel amplifier of claim 7, wherein the microprocessor and memory device are included within a microcontroller functionally coupled to the digital signal processor.

9. The multichannel amplifier of claim 8, wherein the digital signal processor includes an input signal DSP compressor or an input signal DSP limiter functionally coupled to the microcontroller that limits a maximum audio signal from the digital signal processor to each of the first and second output channels based on a threshold value from the microcontroller.

10. The multichannel amplifier of claim 1, wherein the multi-contact switch is a single switch that includes power share designations and produces an associated signal corresponding to additive balance of power distribution between the first and second output channels.

11. The multichannel amplifier of claim 10, wherein the single switch is a rotary switch or a slide switch.

12. The multichannel amplifier of claim 1, wherein the power supply is functionally coupled to the memory device such that the power output rating of the power supply is stored by the memory device.

13. A multichannel amplifier, comprising:
a. a power supply having a power output rating;
b. first and second output channels each having a fixed impedance, each functionally coupled to the power supply, and each including:
i. a power amplifier functionally coupled to the power supply; and
ii. an adjustable voltage limiter functionally coupled to the power amplifier; and
c. a multi-contact switch having a physical actuator, wherein the first output channel includes first visual indicia that correspond to power output designations for the first output channel, and the second output channel includes second visual indicia that correspond to power output designations for the second output channel, the multi-contact switch producing a present switch mode from a plurality of switch modes and functionally coupled to each of the adjustable voltage limiters of the first and second output channels such that the present switch mode selects a specific voltage limit for each of the first and second output channels thereby limiting power output through each of the first and second output channels to correspond with the first visual indicia and the second visual indicia without requiring a graphical user interface.

14. The multichannel amplifier of claim 13, further comprising an audio input functionally coupled to a digital signal processor which is functionally coupled to each of the first and second output channels.

15. The multichannel amplifier of claim 14, further comprising a microprocessor and an associated memory device that is functionally coupled to the digital signal processor.

16. The multichannel amplifier of claim 15, wherein the digital signal processor includes an input signal DSP compressor or an input signal DSP limiter functionally coupled to the microprocessor that limits a maximum audio signal from the digital signal processor to each of the first and second output channels based on a threshold value from the memory device.

17. The multichannel amplifier of claim 15, further comprising a sensor system functionally coupled to each of the first and second output channels to observe a state there and functionally coupled to the microprocessor to provide state information thereto, and wherein the microprocessor is functionally coupled to each of the adjustable voltage limiters such that the microprocessor may further restrict voltage on a state condition.

18. The multichannel amplifier of claim 17, wherein the state is a voltage, current, or temperature.

19. The multichannel amplifier of claim 13, wherein the first output channel feeds a plurality of speaker lines.

20. A multichannel amplifier, comprising:
a. a power supply having a power output rating;
b. an audio input;
c. first and second output channels each functionally coupled to the power supply and each including:
i. a power amplifier;
ii. an adjustable voltage limiter; and
iii. an adjustable impedance circuit;
d. a restriction controller functionally coupled to each of the first and second output channels, the restriction controller including a set of predefined set first partial power setting such that each output channel is restricted to a particular voltage or impedance requirement identified by a present restriction mode;
e. a multi-contact switch having a single physical actuator that includes power share designations and produces an associated signal corresponding to additive balance of power distribution between the first and second output channels, the multi-contact switch producing a present switch mode from a plurality of switch modes; and
f. a microcontroller that includes machine readable instructions to produce a second partial power setting based on a combination of the power output rating, the present switch mode, and the present restriction mode, the microcontroller including a microprocessor and an associated memory device, the microprocessor and the associated memory device including:
i. a power share input functionally coupled to the multi-contact switch such that the present switch mode thereof is received by the microprocessor;
ii. a switch system input functionally coupled to receive the present restriction mode; and
iii. a power setting output functionally coupled to each of the first and second output channels such that the second partial power setting from the memory device restricts the voltage or impedance of the first output channel via its associated adjustable voltage limiter or adjustable impedance circuit and also restricts the voltage or impedance of the second output channel via its associated adjustable voltage limiter or adjustable impedance circuit, thereby selectably sharing power output of the power supply therebetween without use of a graphical user interface; and
g. an input signal DSP compressor or an input signal DSP limiter functionally coupled between the audio input and the first and second output channels and functionally coupled to the microcontroller, wherein the input signal DSP compressor or the input signal DSP limiter limits a maximum audio signal to each of the first and second output channels based on a threshold value from the microcontroller.

* * * * *